United States Patent
Mehta et al.

(10) Patent No.: US 7,696,021 B2
(45) Date of Patent: Apr. 13, 2010

(54) SEMICONDUCTOR DEVICE MANUFACTURED USING A NON-CONTACT IMPLANT METROLOGY

(75) Inventors: Narendra Singh Mehta, Dallas, TX (US); Ajith Varghese, McKinney, TX (US); Benjamin Moser, Chandler, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 158 days.

(21) Appl. No.: 11/559,271

(22) Filed: Nov. 13, 2006
(Under 37 CFR 1.47)

(65) Prior Publication Data

US 2008/0006886 A1 Jan. 10, 2008

Related U.S. Application Data

(60) Provisional application No. 60/736,435, filed on Nov. 14, 2005.

(51) Int. Cl.
*H01L 21/00* (2006.01)

(52) U.S. Cl. ...................................................... 438/149

(58) Field of Classification Search ....................... None
See application file for complete search history.

(56) References Cited

U.S. PATENT DOCUMENTS

| | | | |
|---|---|---|---|
| 7,403,023 B2 * | 7/2008 | Steeples et al. | 324/752 |
| 2003/0040130 A1 * | 2/2003 | Mayur et al. | 438/14 |
| 2004/0166612 A1 * | 8/2004 | Maydan et al. | 438/149 |

* cited by examiner

*Primary Examiner*—Charles D Garber
*Assistant Examiner*—Andre' C Stevenson
(74) *Attorney, Agent, or Firm*—Warren L. Franz; Wade J. Brady, III; Frederick J. Telecky, Jr.

(57) ABSTRACT

A method of manufacturing a semiconductor device including calibrating an ion implant process. The calibration includes forming a dielectric layer over a calibration substrate. A dopant is implanted into the dielectric layer. Charge is deposited on a surface of the dielectric layer, and voltage on the surface is measured. An electrical characteristic of the dielectric layer is determined, and a doping level of the dielectric layer is determined from the electrical characteristic. The electrical characteristic is associated with an operating setpoint of the ion implant process. The calibrated ion implant process is used to implant the dopant into a semiconductor substrate.

15 Claims, 5 Drawing Sheets

SEMICONDUCTOR DEVICE MANUFACTURED USING A NON-CONTACT IMPLANT METROLOGY

CROSS-REFERENCE TO PROVISIONAL APPLICATION

This application claims the benefit of U.S. Provisional Application No. 60/736,435 entitled "NON-CONTACT IMPLANT DOSE AND ENERGY METROLOGY FOR ADVANCED CMOS LOW ENERGY IMPLANTS" to Narendra Singh Mehta, et al., filed on Nov. 14, 2005 which is commonly assigned with the present invention and incorporated herein by reference as if reproduced herein in its entirety.

TECHNICAL FIELD OF THE INVENTION

The invention is directed, in general, to semiconductor device manufacturing and, more specifically, to a non-contact method of characterizing an implant process.

BACKGROUND OF THE INVENTION

As the size of MOS transistor features continues to shrink, some dopants used to fabricate the transistors are implanted at shallower depths. Specifically, so-called "ultra-shallow" junctions are thought to successfully improve device performance with scaling. These junctions generally provide better threshold voltage control, improve transistor performance, reduce CHC (Channel Hot Carrier) degradation and reduce parasitic capacitance.

In the past, an implant process could be characterized by physical contact with a metrology wafer into which the dopant is implanted using the production process. When the implant energy of a dopant is sufficiently high, and the implant depth sufficiently large, four-point measurement may be used to determine the resistivity of the metrology wafer. However, when the depth of the doped region is less than about the spacing between electrodes used for four-point measurement, electric field lines of the four-point probe may extend below the doped layer.

In this case the measured resistivity may be dominated by the undoped substrate below the doped layer. Thus, four-point measurement of test doped layers formed by shallow implants may not accurately represent the characteristics of the doped layer. As a result, sheet resistance measurements become unreliable for manufacturing purposes. This limitation is particularly applicable for shallow implants used in MOS transistor technology associated with a transistor gate length of about 45 nm or less.

Accordingly, what is needed in the art is a method of characterizing shallow junction implant processes that overcomes the limitations of the prior art.

SUMMARY OF THE INVENTION

The invention, in one aspect, provides a method of manufacturing a semiconductor device. The method includes calibrating an ion implant process by forming an oxide layer over a calibration substrate. A dopant is implanted into the oxide layer, and charge is deposited on a surface of the oxide layer using a coronal discharge. A voltage on the surface of the oxide layer is measured using an oscillating probe, and an electrical characteristic of the oxide layer is determined therefrom. The electrical characteristic is associated with an ion implant process operating set-point to calibrate the ion implant process. The dopant is implanted into source/drain regions in a semiconductor substrate using the calibrated ion implant process.

Another embodiment is a method of manufacturing a semiconductor device. The method includes calibrating an ion implant process by forming a dielectric layer over a calibration substrate. A dopant is implanted into the dielectric layer, and an electrical characteristic of the dielectric layer is determined. The electrical characteristic is associated with an ion implant process operating set-point to calibrate the ion implant process. The calibrated ion implant process is used to implant the dopant into a semiconductor substrate.

Another embodiment is a semiconductor device, including a semiconductor substrate and transistors formed thereover. The transistors have source/drain regions formed by an implant process calibrated by forming a dielectric layer over a calibration substrate. A dopant is implanted into the dielectric layers and charge is deposited on a surface of the dielectric layer using a coronal discharge. A voltage on the surface of the dielectric layer is measured, and an electrical characteristic of the dielectric layer is determined therefrom. The electrical characteristic is associated with a concentration of a dopant in the doped regions to calibrate the ion implant process. Interconnect layers within dielectric layers over the transistors are configured to connect the transistors.

BRIEF DESCRIPTION OF THE DRAWINGS

For a more complete understanding of the present invention, reference is now made to the following descriptions taken in conjunction with the accompanying drawings, in which.

DETAILED DESCRIPTION

The present invention recognizes that a manufacturable non-contact method of determining electrical characteristics of shallow dopant implants may be used to calibrate an implant process to maintain consistent performance of semiconductor devices formed using the implant process.

The implant process may be calibrated for a desired dopant species by forming a dielectric layer. The dopant is implanted into the dielectric layer and creates damage therein. A non-contact corona charge deposition technique may be used to characterize electrical properties of the dielectric layer, which are altered by damage caused by the implant process. Changes to the electrical properties can then be used to monitor the implant process.

Figure 1A:
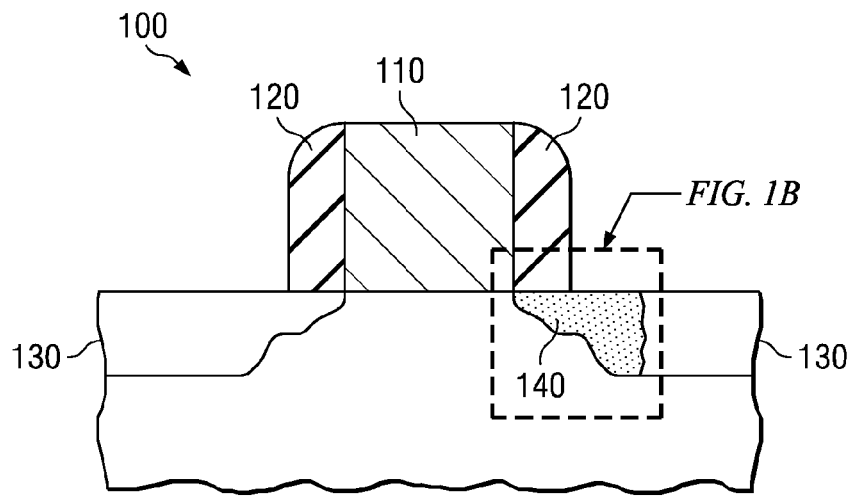
FIG. 1 illustrates a MOS transistor.
Figure 1B:
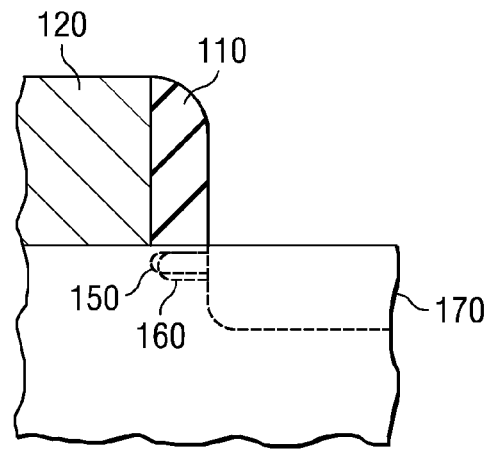

FIG. 1 illustrates a MOS transistor 100. The transistor 100 includes a gate structure 110 and sidewall structures 120. Source/drain regions 130 are adjacent the gate structure 110, and are formed using one or more ion implant processes that place impurity atoms into the source/drain regions 130 to produce desired transistor electrical characteristics.

The source/drain regions 130 include a portion 140 in which the depth and concentration of dopants in the source/drain regions 130 are varied to reduce certain undesirable effects such as channel hot carrier (CHC) and parasitic capacitance. To achieve the desired dopant distribution, the source/drain regions are typically formed using multiple dopant implants of varying energy and implant angle. For example, the source/drain regions 130 may include a lightly doped drain (LDD) or a medium-doped drain (MDD) portion 150, a source/drain extension (SDE) portion 160 and a source/drain portion 170. The LDD/MDD 150 and SDE 160 portions may be significantly shallower than the source/drain portion 170.

Unstable electrical performance of the transistors 100 over time is highly undesirable in a manufacturing environment. Improving consistency of the implant process used to form the LDD/MDD 150 and SDE 160 portions may reduce this instability. By monitoring the implant process over time, the consistency of the implant process may be improved.

The method described herein employs characterization techniques that focus on a thin doped region near the surface of a doped dielectric film. As discussed below, electrical thickness, tunneling field, and resistivity may be determined using noncontact methods that provide the desired sensitivity to the portion of the dielectric film containing the implanted dopant. These electrical characteristics may be associated with ion implant process conditions, including dose, energy and implant species, in order to calibrate the implant process.

Figure 2:
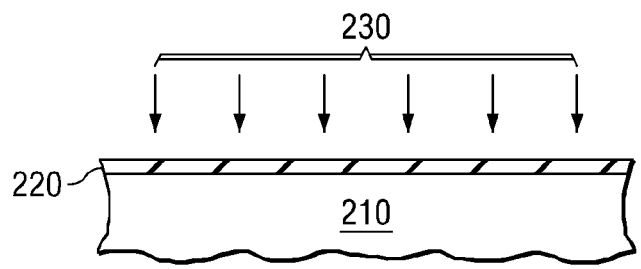
FIG. 2 illustrates implantation of a dopant.

FIG. 2 illustrates a calibration substrate 210 on which a dielectric layer 220 has been formed. In one aspect, the calibration substrate 210 may be a semiconductor substrate on which a high-quality dielectric layer may be formed. In another aspect, the calibration substrate 210 has sufficient conductivity to act as a lower electrode of a parallel-plate capacitor using the dielectric layer 220 as a polarizable medium. In one embodiment, the calibration substrate 210 is used to calibrate a process and is not used to manufacture semiconductor devices thereon.

The dielectric layer 220 may be any dielectric material having high initial resistivity and low concentration of defects that may act as charge traps and enable electron mobility. In one aspect, the dielectric layer 220 may be a thermally grown oxide of the calibration substrate 210. Other dielectrics may also be used, such as a thermally grown nitride or a dielectric formed by a chemical vapor deposition (CVD) or a physical vapor deposition (PVD) process. In one embodiment, the calibration substrate 210 is a doped silicon wafer, and the dielectric layer 220 is thermally grown silicon dioxide.

An ion implant process 230 is used to implant a dopant into the dielectric layer 220. An ion implant process is a process by which impurity atoms, or dopants, are placed into a semiconductor substrate. The dopants are generally ionized and then accelerated by an electric field to a velocity sufficient to penetrate the surface of the substrate. Typically, the depth and distribution of the implanted impurity atoms are determined in part by the implant species, energy of the accelerated ions (expressed in units of keV or MeV), and dose (expressed as atoms/cm$^2$ of the substrate surface).

The implant process 230 may be a production ion implant process used to form the LDD/MDD 150 and SDE 160 regions of the MOS transistor 100. Implanted species may include boron (B), arsenic (As), and phosphorous (P), but the method is not so limited. When forming shallow doped regions such as the LDD/MDD 150 and SDE 160 regions, As, e.g., may be implanted with energy of about 9 keV at a dose of about 1E14 atoms/cm$^2$.

Figure 3:
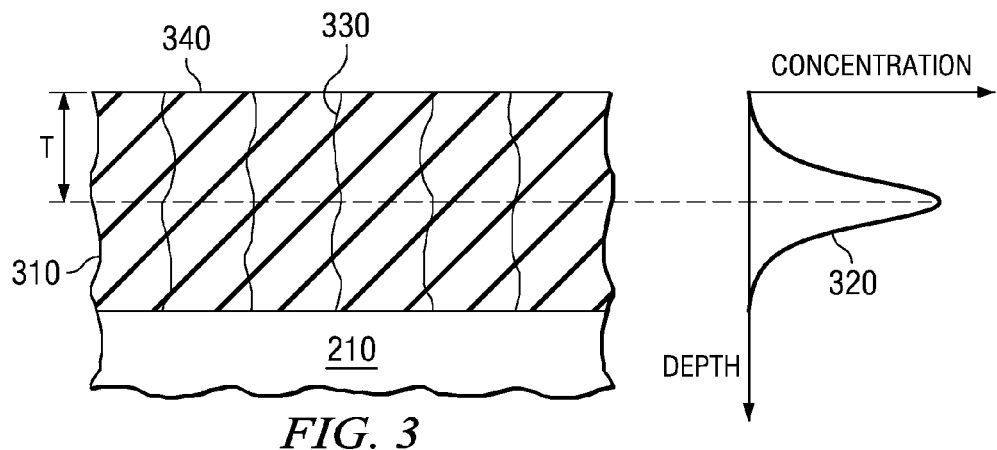
FIG. 3 illustrates a dielectric layer into which a dopant has been implanted.

FIG. 3 illustrates a doped dielectric layer 310 resulting from implanting the dopant into the dielectric layer 220. The ion implantation process 230 results in a distribution 320 of the dopant in the doped dielectric layer 310. The distribution 320 has a peak concentration at a mean depth T and a standard deviation (not shown) about the mean. The dopant atoms may break bonds between atoms in the doped dielectric layer 310, resulting in dangling bonds therein. The dopant atoms may also have unfilled atomic orbitals resulting in additional dangling bonds. The dangling bonds may result in conduction paths 330 in the dielectric layer 310 which provide a relatively low resistance path from a surface 340 of the doped dielectric layer 310 to the substrate 210 thereunder. Implications of these paths 330 are discussed below.

In one aspect, the thickness of the dielectric layer 220 is chosen to provide sufficient sensitivity of measured electrical characteristics of the doped dielectric layer 310. If the dielectric layer 310 is too thin, the dopant and implantation damage therein may result in sufficient conductivity to make measurement of capacitance difficult. Conversely, if the doped dielectric layer 310 is too thick, conductivity may be below detection limits. In general, a desired thickness of the dielectric layer 220 is dependent on the conditions used to implant the dopant. In one embodiment, the dielectric layer 220 is a thermal silicon dioxide layer with a thickness of about 50 nm. This thickness provides sufficient sensitivity to characterize a process implanting As with an energy ranging from about 6 keV to about 12 keV, and a dose ranging from about 1E14 atoms/cm$^2$ to about 1E15 atoms/cm$^2$.

Figure 4:
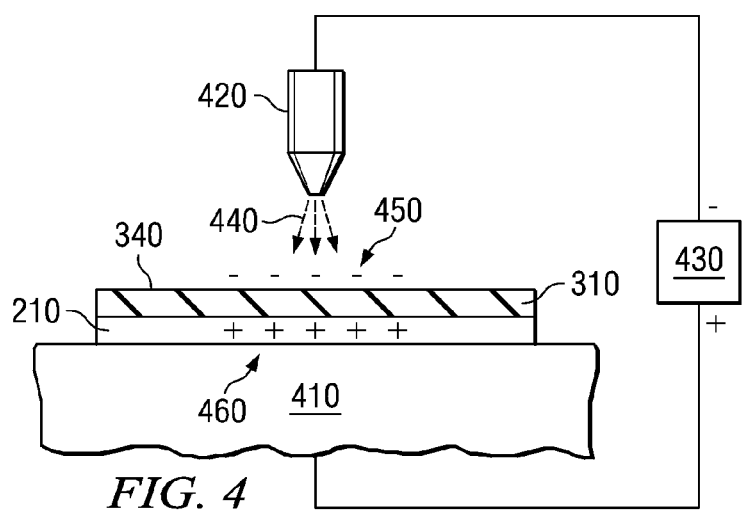
FIGS. 4 and 5 illustrate electrical characterization of a doped dielectric layer.

FIG. 4 illustrates the placement of electric charge $Q_{surface}$ on the surface 340 of the doped dielectric layer 310. In an embodiment, the substrate 210 with the doped dielectric layer 310 thereon rests on a cathode 410. A corona gun 420 acts as an anode and is energized by a power source 430 to produce an electron flux 440. A corona gun is a source of electrons produced by an electrode raised to a high electrical potential. Electrons may "boil" off the surface of the electrode and travel to the surface 340. Because the doped dielectric layer 310 is a dielectric material, some electrons impinging on the surface 340 are relatively immobile.

The surface charge 450 creates a surface potential on the surface 340 and an image charge 460 in the substrate 210. The surface charge 450 and the image charge 460 act as plates of a "virtual" parallel-plate capacitor with the portion of the doped dielectric layer 310 therebetween acting as the polarizable medium of the capacitor.

Figure 5:
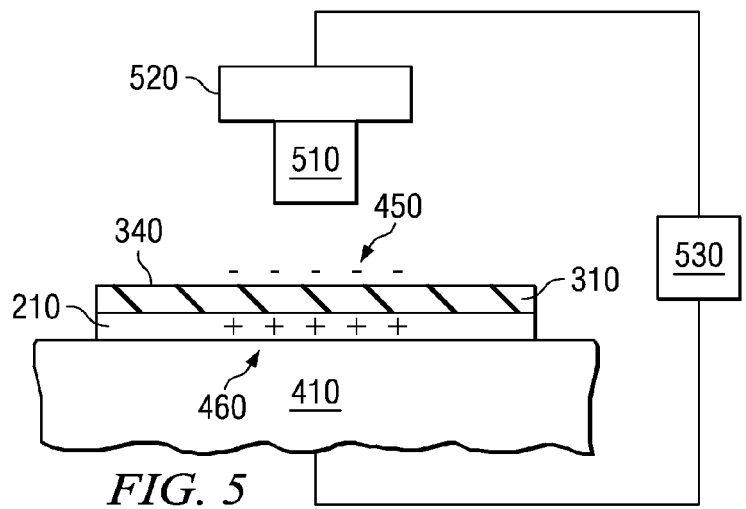

FIG. 5 illustrates an electrostatic probe 510 used to measure the electrical potential on the surface 340 produced by the surface charge 450. In one aspect, the electrostatic probe 510 may be a Kelvin probe. A Kelvin probe is well known in the art and is therefore only briefly described here. A Kelvin probe typically includes a capacitive element (not shown) and a vibrator 520. The capacitive element is positioned proximate a charge layer with a small air gap. The vibrator 520 causes the distance between the charge layer and the capacitive element to vary, thus inducing a time-varying electric voltage on the capacitive element. The time-varying voltage is converted to a useable signal by a controller 530, and a value of the surface charge 450 is derived therefrom.

Without limitation, a tool that provides the described functionality is a Quantox™ XP in-line electrical monitoring and characterization system manufactured by KLA-Tencor, San Jose, Calif. The Quantox™ system provides an integrated capability to deposit the coronal charge on the surface of the doped dielectric layer 310 and to measure the surface charge 450 using a Kelvin probe. The Quantox™ system mounts a corona gun and a Kelvin probe on a translatable stage that permits measurement of the substrate voltage after deposition of charge on the surface without manipulation of the substrate 210. Moreover, the Quantox™ system is compatible with production clean room environments used to fabricate integrated circuits.

The capacitance of the virtual capacitor may be determined from the value of the surface charge $Q_{surface}$ and the measured potential of the surface charge. The well-known relation $$C_{film} = \frac{Q_{surface}}{V_{surface}} \quad (1)$$

provides the relationship between these values.

An electrical thickness of the doped dielectric layer 310 may be determined from the computed capacitance. Electrical thickness as used herein means an equivalent thickness of the doped dielectric layer 310 assuming a material layer with homogeneous resistivity and dielectric permittivity. The electrical thickness may be determined from the equation for a parallel-plate capacitor; namely, $$T_{Electrical} = \frac{\kappa \varepsilon_o A}{C_{film}} \quad (2)$$

where κ is the relative dielectric permittivity of the dielectric layer 220, $\varepsilon_o$ is the permittivity of free space, A is the area of the capacitor (the Kelvin probe capacitive element), and $C_{film}$ is the capacitance calculated from EQ. 1. It is apparent from EQ. 2 that the electrical thickness is inversely proportional to $C_{film}$. As a result, changes of the calculated capacitance result in inversely proportional changes of the electrical thickness.

Without limitation by theory, it is believed that the capacitance may be changed when impurity atoms are implanted into the doped dielectric layer 310. It is thought that the dopant atoms increase the number of polarizable sites in the doped dielectric layer 310, resulting in an increase of the relative dielectric permittivity of the doped dielectric layer 310. When the relative permittivity of the doped dielectric layer 310 increases, the capacitance produced by a given charge $Q_{surface}$ also increases. Referring to EQ. 2, the increased capacitance then results in a reduced electrical thickness of the doped dielectric layer 310.

It is also thought that the doped portion of the doped dielectric layer 310 may act as a plate of the virtual capacitor, thereby decreasing the distance between the charged regions bordering the undoped portions of the doped dielectric 310. This lower distance will increase the calculated capacitance of the virtual capacitor, thereby decreasing the computed electrical thickness of the doped dielectric layer 310. The combination of these effects is expected to result in a decrease of the electrical thickness and resistivity of the doped dielectric layer 310 as the doping level and implant energy of the dopant are increased.

Figure 6:
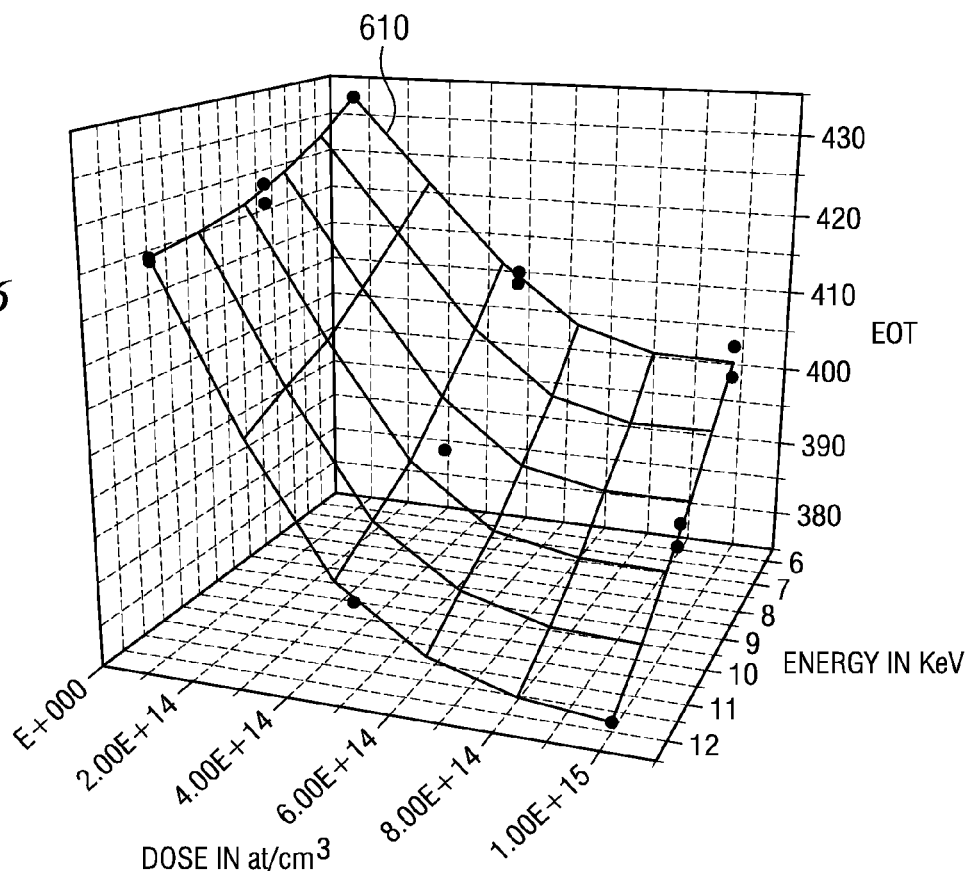
FIGS. 6-8 illustrate of electrical characteristics of a doped oxide layer.

FIG. 6 illustrates a surface response 610 of the calculated electrical thickness of a silicon dioxide layer as a function of As implant energy and dose. In FIG. 6, the electrical thickness of the silicon dioxide layer decreases smoothly in a monotonic manner as either the implant energy or the dose increases. Desired electrical characteristics of transistors formed using the implant process may advantageously be correlated with a point on the response surface 610. If desired, multiple implant conditions may be characterized to enable computation of the implant energy and dose corresponding to a calculated electrical thickness.

If an excursion of the electrical dielectric thickness of a monitor wafer is observed, it can be inferred that electrical characteristics of transistors will undesirably change from their desired values, and appropriate action may be taken to return the production implant process to its desired operating set-point. In this manner, the production implant process is calibrated.

In another embodiment, a measure of the tunneling field strength is used to characterize the implant process 230. The tunneling field strength of the doped dielectric layer 310 is the maximum potential that may be produced by a corona discharge on the surface 340. The maximum sustainable charge on the surface 340 associated with the maximum potential is a "saturation charge." It is thought that at the tunneling field strength, current from the corona gun 420 is balanced by current through the doped dielectric layer 310 by quantum tunneling so that a potential strength does not exceed a maximum value, i.e., the tunneling field strength. It is further thought that the current occurs by electron hopping between the defects previously described in the doped dielectric layer 310 produced by the implant process 230. Thus, more current is able to flow by tunneling effects as additional damage occurs to the doped dielectric layer 310.

Figure 7:
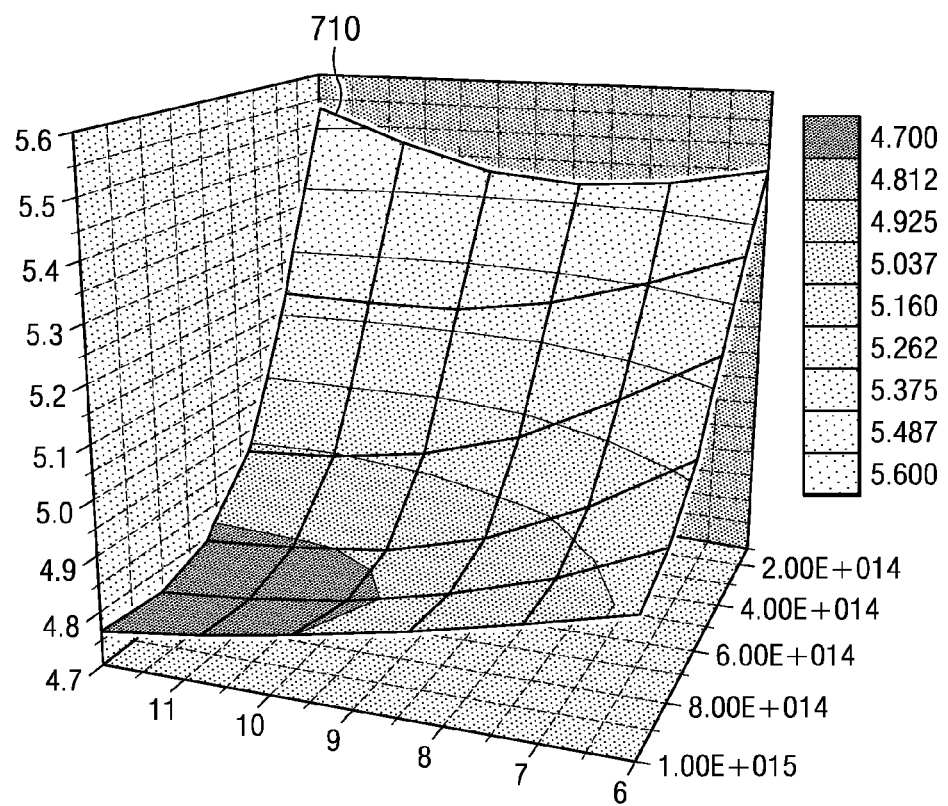

FIG. 7 illustrates a surface response 710 of the tunneling field strength of a silicon dioxide layer as a function of As implant energy and dose as determined using a Quantox™ system. In FIG. 7, the tunneling field again decreases monotonically as either the implant energy or dose is increased. Advantageously, the well-behaved nature of the response surface 710 provides another means to monitor the implant process 230. As for the electrical thickness, desirable electrical characteristics of production transistors may be correlated with the measured tunneling field strength of the dielectric layer 310. A deviation of the tunneling field strength from a calibrated value is a signal that the implant process may have drifted, and appropriate corrective action may be taken to return or adjust process parameters to a setting that appropriately corrects the drift.

Another electrical characteristic of the doped dielectric layer 310 that may be used to monitor the implant process 230 is resistivity of the doped dielectric layer 310. The resistivity of a material is a measure of how well the material opposes the flow of current, and is typically expressed in SI units of ohm-cm. The resistivity ρ of the doped dielectric layer 310 may be determined from Ohm's law by characterizing the current flow through the doped dielectric layer 310 at a known potential of the surface 340, with knowledge of the physical thickness of the doped dielectric layer 310. The resistivity may then be determined by the relationship $$\rho = \frac{V_{surface} A}{IT} \quad (3)$$

where $V_{surface}$ is the potential produced by the surface charge 450, A is the area of the portion of the dielectric layer 340 characterized, I is the measured current and T is the physical thickness of the doped dielectric layer 310.

Figure 8:
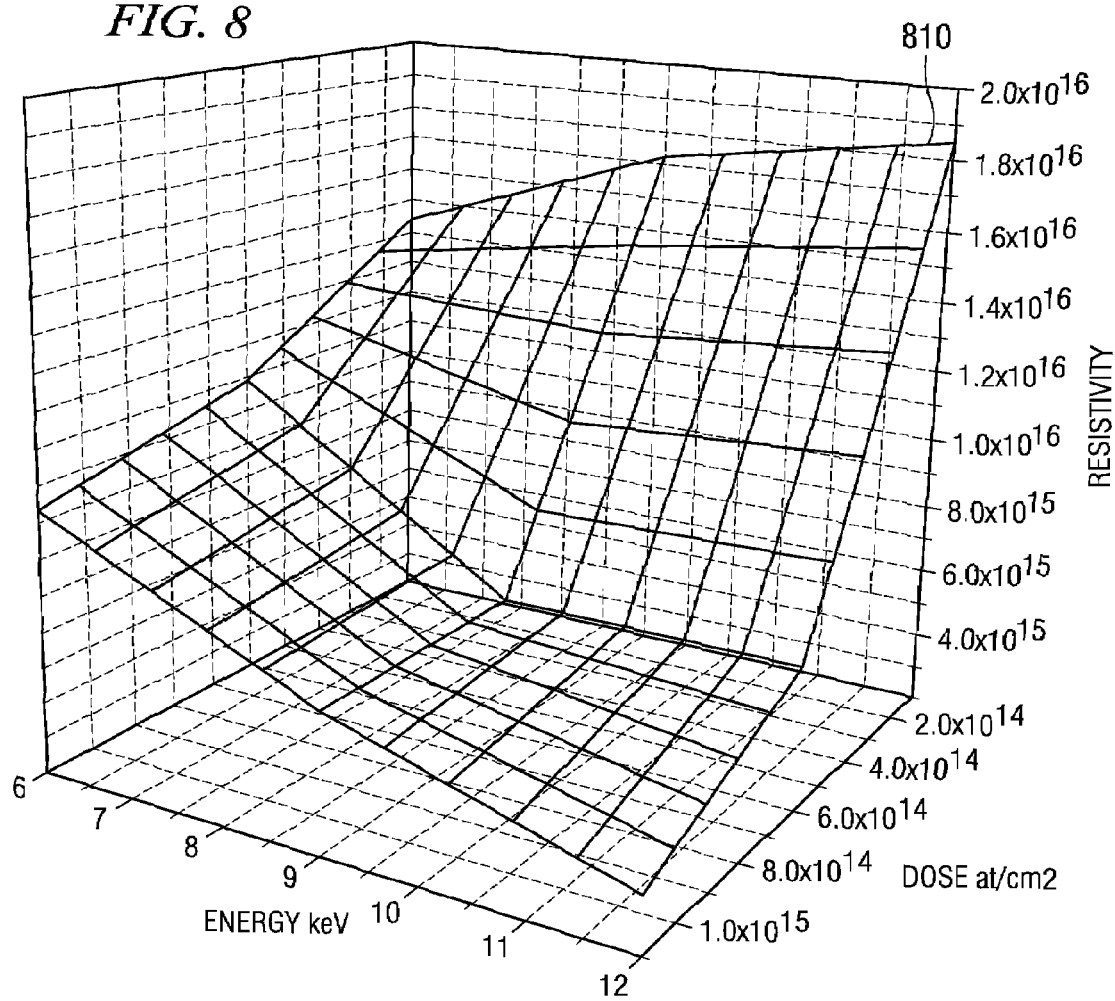

FIG. 8 illustrates a response surface 810 of the calculated resistivity of a silicon dioxide layer determined using a Quantox™ system. The resistivity again decreases monotonically as either the implant energy or dose is increased. The response surface 810 provides yet another means to monitor the implant process 230, using the correlation method described previously.

Summarizing, the described method provides a manufacturable means of monitoring the implant process 230 used to produce shallow implants in production transistors. The electrical thickness, tunneling field and resistivity of the doped dielectric layer 310 each provide a means to monitor the implant process 230. When one of these characteristics deviates from a value known to be correlated with desirable electrical performance characteristics of production transistors formed using the implant process 230, the implant process 230 may be investigated to determine the cause of the deviation and corrective may be taken.

In addition, while the previously described embodiment illustrates use of the method to form LDD/MDD and SDE implants in a MOS transistor, the method is not so limited. The method may also be used with other implant processes, including but not limited to HALO (high-angle, low energy) implants, "pocket" implants, channel implants and formation of doped regions of bipolar junction transistors.

Moreover, the described method may be easily adapted as a metrology method for ion implantation processes. The electrical thickness, tunneling field and resistivity characteristics of a doped dielectric layer may be used individually or in combination to determine the implant dose from the implant energy or the implant energy from the implant dose. Thus, the elements of the method may find broad application in the ion implantation arts.

Figure 9:
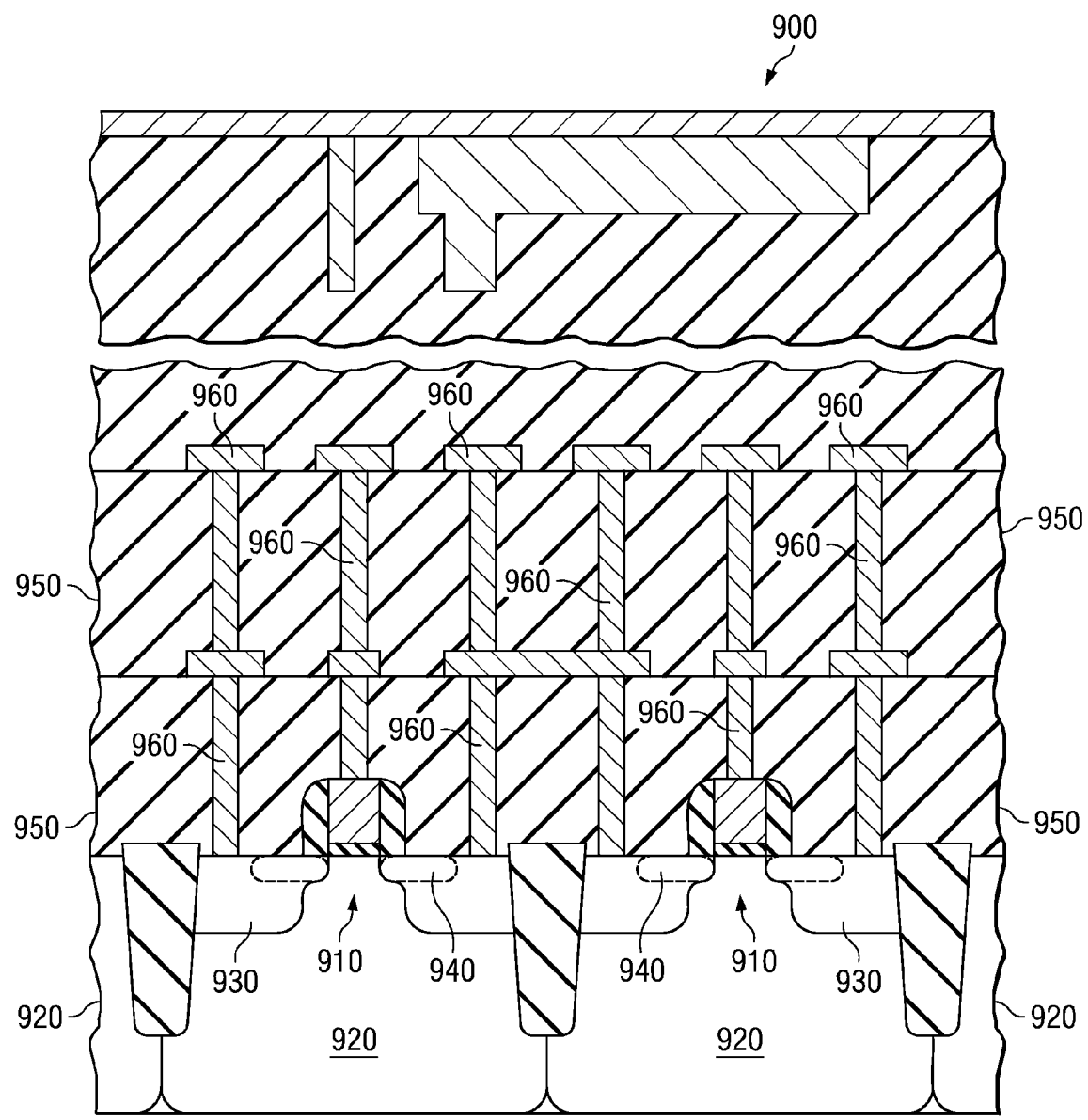
FIG. 9 illustrates an integrated circuit.

FIG. 9 illustrates an integrated circuit (IC) 900 formed using an implant process calibrated by the method described herein. Transistors 910 are formed over a substrate 920, and include source/drain regions 930. The source/drain regions 930 are formed using an implant process that has been calibrated by monitoring an electrical characteristic of a calibration substrate. The calibrated implant process may be used to form a shallow implant region 940 such as an MDD or an SDE of the transistors 910.

The IC 900 may include MOS, BiCMOS or bipolar components, and may further include passive components, such as capacitors, inductors or resistors. It may also include optical components or optoelectronic components. Those skilled in the art are familiar with these various types of components and their manufacture. The IC 900 may also be a dual-voltage IC, comprising transistors operating with difference threshold voltages.

Dielectric layers 950 may be fabricated over the transistors 910 using currently known or later discovered methods. Additionally, interconnect structures 960 are located within the dielectric layers 950 to connect various components, thus forming the operational integrated circuit 900. It will be apparent to one skilled in the art that several variations of the example interconnect architecture may be fabricated according to the principles of the invention with similarly advantageous results.

Those skilled in the art to which the invention relates will appreciate that other and further additions, deletions, substitutions and modifications may be made to the described embodiments without departing from the scope of the invention.

What is claimed is:

1. A method of manufacturing a semiconductor device, comprising:
    calibrating an ion implant process, including:
        forming an oxide layer over a calibration substrate;
        implanting a dopant into said oxide layer, said dopant having a peak concentration within said oxide layer;
        depositing charge on a surface of said oxide layer using a coronal discharge;
        measuring a voltage on a surface of said oxide layer using an oscillating probe;
        determining an electrical characteristic of said oxide layer; and
        associating said electrical characteristic with an operating set-point of said ion implant process; and
    using said calibrated ion implant process to implant said dopant into source/drain regions in a semiconductor substrate; wherein said source/drain regions include medium density drain (MDD) regions formed by said calibrated ion implant process.

2. The method recited in claim 1, wherein said oscillating probe is a Kelvin probe.

3. The method recited in claim 1, wherein said electrical characteristic is a tunneling field strength of said oxide.

4. The method recited in claim 3, wherein said depositing produces a saturation charge on said oxide surface.

5. The method recited in claim 1, wherein said electrical characteristic is an electrical thickness or a resistivity of said oxide.

6. A method of manufacturing a semiconductor device comprising:
    calibrating an ion implant process, including:
        forming a dielectric layer over a calibration substrate;
        implanting a dopant into said dielectric layer;
        determining an electrical characteristic of said dielectric layer, said dopant having a peak concentration within said dielectric layer; and
        associating said electrical characteristic with an operating set-point of said ion implant process; and
    using said calibrated ion implant process to implant said dopant into a semiconductor substrate;
    wherein said ion implant process implants said dopant into source/drain regions of a MOS transistor; and
    wherein said source/drain regions include medium density drain (MDD) regions formed by said calibrated ion implant process.

7. The method recited in claim 6, wherein determining an electrical characteristic includes depositing a charge on a surface of said dielectric layer and measuring a voltage on a surface of said dielectric layer.

8. The method recited in claim 6, wherein said charge is deposited by a coronal discharge.

9. The method recited in claim 6, wherein said depositing produces a saturation charge on said oxide surface.

10. The method recited in claim 6, wherein said source/drain regions include source/drain extension (SDE) regions formed by said calibrated ion implant process.

11. The method recited in claim 6, wherein said calibrated ion implant process implants As, B or P.

12. The method recited in claim 6, wherein said electrical characteristic is a tunneling field strength of said oxide.

13. The method recited in claim 6, wherein said electrical characteristic is an electrical thickness of said oxide.

14. The method recited in claim 6, wherein said electrical characteristic is a resistivity of said oxide.

15. The method of claim 6, wherein the semiconductor device is an integrated circuit, and the method further comprises:
    forming gate electrodes over said semiconductor substrate, said gate electrodes and said source/drain regions forming transistors;
    forming dielectric layers over said gate electrodes; and
    forming interconnects located over and within said dielectric layers that interconnect said transistors.

* * * * *